(12) United States Patent
Aal (10) Patent No.: US 12,071,083 B2
(45) Date of Patent: Aug. 27, 2024

(54) AUTOMOBILE ELECTRONIC SYSTEM (71) Applicant: Volkswagen Aktiengesellschaft, Wolfsburg (DE)

(72) Inventor: Andreas Aal, Braunschweig (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 441 days.

(21) Appl. No.: 17/605,100

(22) PCT Filed: Apr. 23, 2020

(86) PCT No.: PCT/EP2020/061386
§ 371 (c)(1),
(2) Date: Oct. 20, 2021

(87) PCT Pub. No.: WO2020/216864
PCT Pub. Date: Oct. 29, 2020

(65) Prior Publication Data
US 2022/0203910 A1      Jun. 30, 2022

(30) Foreign Application Priority Data

Apr. 25, 2019 (EP) ..................... 19171138

(51) Int. Cl.
*B60R 16/023* (2006.01)
*G06F 1/20* (2006.01)
(Continued)

(52) U.S. Cl.
CPC .......... *B60R 16/0239* (2013.01); *G06F 1/206* (2013.01); *H05K 1/0203* (2013.01); *H05K 1/185* (2013.01)

(58) Field of Classification Search
CPC ............. H05K 7/20563; H05K 7/1461; H05K 7/20636; H05K 7/20645; H05K 7/20763;
(Continued)

(56) References Cited

U.S. PATENT DOCUMENTS

| 4,893,590 A | 1/1990 | Kashimura et al. ....... 123/41.31 |
| 5,424,916 A * | 6/1995 | Martin ............... H05K 7/20636 |
| | | 361/698 |

(Continued)

FOREIGN PATENT DOCUMENTS

| CN | 101888766 A | 11/2010 | ............... H05K 7/14 |
| CN | 102802381 A | 11/2012 | ............. H01L 23/46 |

(Continued)

OTHER PUBLICATIONS

Ennenga et al., Electronic equipment protected against dust and water—has hermetic sealing gasket compressed by flange around all sides of hole provided for socket mounting on inner wall (Year: 1994).*

(Continued)

*Primary Examiner* — Michael A Matey
(74) *Attorney, Agent, or Firm* — Slayden Grubert Beard PLLC (57) ABSTRACT

The invention relates to automobile electronic system comprising one or more domain computer centers for embedding electronic units forming parts of the automobile electronic system; and two or more module housings, each of which accommodating at least one of said electronic units; wherein each of the domain computer centers comprises two or more plug-in pockets and each of the module housings is plugged within respective one plug-in pocket, and wherein each plug-in pocket is embedded within a respective domain computer center by at least one apparatus for decoupling a respective plugged module housing from environmental (Continued)

factors. The domain computer centers further has a liquid-cooling apparatus integrated for cooling module housings plugged-in. The invention relates furthermore to corresponding domain computer centers and module housings and to a method for the integration of electronic units into such an automobile electronic system.

18 Claims, 4 Drawing Sheets

(51) Int. Cl.
*H05K 1/02* (2006.01)
*H05K 1/18* (2006.01)

(58) Field of Classification Search
CPC ............ H05K 7/20772; H05K 7/1424; H05K 7/20927; H05K 7/1404; H05K 7/20781; H05K 5/0047; H05K 7/1418; H05K 7/1427; H05K 7/20736; H05K 7/20881; H05K 9/0007; H05K 1/0203; H05K 1/185; G06F 1/20; G06F 2200/201; G06F 1/2206; B60R 16/0239
See application file for complete search history.

(56) References Cited

U.S. PATENT DOCUMENTS

| | | | | |
|---|---|---|---|---|
| 6,198,244 | B1 | 3/2001 | Hayden et al. ............... 318/466 |
| 6,850,415 | B2* | 2/2005 | Dimarco ............. H05K 7/1451 | 361/752 |
| 7,272,015 | B2 | 9/2007 | Karrer et al. ................ 361/790 |
| 7,450,384 | B2* | 11/2008 | Tavassoli ........... H05K 7/20636 | 361/689 |
| 7,684,195 | B2 | 3/2010 | Kerner et al. ............... 361/699 |
| 7,990,726 | B2* | 8/2011 | Izuhara ............. H05K 7/20563 | 174/559 |
| 8,446,722 | B2* | 5/2013 | Fowler ................ H05K 7/1418 | 361/756 |
| 8,477,498 | B2* | 7/2013 | Porreca ............... H05K 7/1404 | 361/708 |
| 9,493,126 | B2 | 11/2016 | Yang et al. |
| 9,699,937 | B2* | 7/2017 | Merlet ............... H05K 7/20127 |
| 10,299,413 | B2* | 5/2019 | Cui ..................... H05K 7/1487 |
| 2004/0227402 | A1 | 11/2004 | Fehr et al. .................... 307/10.1 |
| 2008/0123297 | A1* | 5/2008 | Tilton ................ H05K 7/20345 | 361/700 |
| 2010/0290186 | A1 | 11/2010 | Zeng et al. ................... 361/694 |
| 2012/0210730 | A1* | 8/2012 | Pruett ..................... F25B 21/02 | 62/3.2 |
| 2013/0128460 | A1* | 5/2013 | Rossi ................. H05K 7/20772 | 361/699 |
| 2014/0233175 | A1* | 8/2014 | Demange .......... H05K 7/20254 | 361/699 |
| 2015/0034271 | A1* | 2/2015 | Jin ..................... H05K 7/20272 | 165/80.4 |
| 2015/0251610 | A1 | 9/2015 | Kugelstadt et al. ........ 298/17 R |
| 2015/0289394 | A1* | 10/2015 | Kalhoff ................ H05K 5/0082 | 361/752 |
| 2016/0277208 | A1 | 9/2016 | Petrucci et al. ............. 398/111 |
| 2018/0269781 | A1 | 9/2018 | Amaducci |
| 2020/0029469 | A1* | 1/2020 | McCordic .......... H05K 7/20645 |

FOREIGN PATENT DOCUMENTS

| | | | | |
|---|---|---|---|---|
| CN | 207151026 U | | 3/2018 | ............... H05K 7/00 |
| CN | 208515373 U | * | 2/2019 | |
| DE | 4223935 A1 | | 1/1994 | ............ B60R 16/02 |
| DE | 4223935 C2 | * | 7/1999 | ......... B60R 16/0239 |
| DE | 102004012095 A1 | | 10/2005 | ............... H05K 1/14 |
| DE | 102005001148 B3 | | 5/2006 | ............ B60R 16/02 |
| DE | 102007013906 A1 | | 10/2008 | ............ B60R 16/02 |
| DE | 102014118043 A1 | | 3/2016 | ............... H05K 7/14 |
| EP | 1264738 A2 | | 12/2002 | ............ B60R 16/02 |
| EP | 1627778 A1 | | 2/2006 | ............ B60R 16/02 |
| EP | 3730348 A1 | | 10/2020 | ........... B60R 16/023 |
| JP | 2015046464 A | | 3/2015 | ............ B60R 16/02 |
| WO | 93/33681 A1 | | 8/1998 | ............ B60R 16/02 |
| WO | 2007/014801 A2 | | 2/2007 | ......... B60R 16/0239 |
| WO | 2020/216864 A1 | | 10/2020 | ........... B60R 16/023 |

OTHER PUBLICATIONS

Ye et al., A hybrid electric vehicle thermal management system (Year: 2019).*
Extended European Search Report, Application No. 19171138.1, 8 pages.
International Search Report and Written Opinion, Application No. PCT/EP2020/061386, 11 pages.
CN 101888766 A, US 2010/0290186 A1.

* cited by examiner

AUTOMOBILE ELECTRONIC SYSTEM

CROSS-REFERENCE TO RELATED APPLICATIONS

This application claims priority to European Patent Application No. EP 191 71 138.1, filed on Apr. 25, 2019 with the European Patent Office. The contents of the aforesaid Patent Application are incorporated herein for all purposes.

TECHNICAL FIELD

The present invention relates to an automobile electronic system comprising one or more domain computer centers for embedding electronic units forming parts of the automobile electronic system, to a domain computer center for embedding electronic units forming parts of such an automobile electronic system, to a module housing accommodating at least one of such electronic units forming parts of such an automobile electronic system and to a method for the integration of electronic units into such an automobile electronic system.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Actual automobile electronic systems, i.e., complex electronic systems meant to be used for automotive applications, as of today, need to include state-of-the-art semiconductors with associated corresponding assembly and package technologies as well as other electronic components with critical key functionalities/features that where originally not designed for automotive use conditions. In order to assure operation in changing automotive environments, in particular concerning to security, safety and/or harsh hardware environment, it is necessary to detect and identify usage deviations from specifications of such components (electronic devices) caused by the form of integration and/or operation concept. Today's test and qualification procedures cannot adapt fast enough to the new automotive environment demands. This causes test and qualification gaps especially in product segments using innovative and leading-edge technologies. Without mitigation or avoidance of such gaps, innovations are introduced with either high risk, costly over-engineering and/or delayed market availability with consequently competitive disadvantages.

Thus, there is more and more a need of a transformation of an automotive manufacturer towards an electronics vendor requiring new vehicle architectures while today's approaches need to be further improved.

SUMMARY

Accordingly, a need exists to provide a new vehicle integration scheme.

The need is addressed by the subject matter according to the independent claims. Embodiments of the invention are described in the dependent claims, the following description, and the drawings.

DESCRIPTION

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

In some embodiments, a new vehicle integration scheme for electronic units, in particular electronic control units but also other electronic hardware components is proposed, that would either complement or replace the actual set of hardware designs as well as their development processes within the supply.

In some embodiments, the vehicle integration scheme enables, for example, for electronic hardware to match to modular software driven requirements, to enable cost efficient, sustainable, dependable, scalable, upgrade- and update capable architectures implementing electronic units into an automobile electronic system that overcome technical hurdles like safety-, security- and reliability gaps as well as economical and logistical hurdles (cost, obsolescence, volume availability, . . . ) in the supply chain.

In particular, an automobile electronic system is proposed, comprising
at least one, e.g., one, two or more, domain computer centers for embedding electronic units forming parts of the automobile electronic system. The domain computer centers may be interconnected by a wired and/or wireless electrical vehicle system for communication between them. The automobile electronic system further comprises
two or more module housings, each of which accommodating at least one of said electronic units;

wherein each of the domain computer centers comprises two or more plug-in pockets and each of the module housings is plugged within respective one plug-in pocket, and wherein each plug-in pocket is embedded within a respective domain computer center by at least one apparatus for decoupling a respective plugged module housing from environmental factors. Further, the domain computer centers may be interconnected by a wired and/or wireless electrical vehicle system for communication between them as well as with sensor and actuator units (S/A in FIG. 1) distributed around the vehicle chassis. The domain computer centers further have a liquid-cooling apparatus integrated for cooling module housings plugged-in, the electronic components implemented therein, respectively.

Furthermore, it is proposed a corresponding domain computer center suitable for the aforementioned automobile electronic system, wherein the domain computer center is constructed for embedding electronic units forming parts of the automobile electronic system and to be interconnected with at least a further of such domain computer center by a wired and/or wireless electrical vehicle system for communication between them, wherein the domain computer center comprises two or more plug-in pockets, into each of which a module housing accommodating at least one of said electronic units may be plugged-in; and wherein each plug-in pocket is embedded within the domain computer center by at least one apparatus for decoupling a respective plugged module housing from environmental factors.

It is furthermore proposed a module housing for an automobile electronic system suitable for the afore-mentioned automobile electronic system, with the module housing accommodating at least one electronic unit and being designed to be plugged-in in a plug-in pocket of a domain computer center, in particular according to the aforementioned one, for embedding electronic units forming parts of the automobile electronic system, which may interconnect two or more of such domain computer centers by a wired and/or wireless electrical vehicle system for communication between them. The domain computer centers may further have a liquid-cooling apparatus integrated for cooling module housings plugged-in, the electronic components implemented therein, respectively.

Domain computer centers may comprise damping means for module housings plugged in. Such damping means may reduce mechanical stress on the module housings and the electronic components implemented therein. The damping means comprises an elastomer buffer. Elastomer may provide the benefit of having less weight, requiring lower volume and are easier to integrate (less construction complexity). For example, the damping means may be configured to absorb mechanical stress from the outside and protect the plug-in pockets. By mechanically decoupling the plug-in pockets a reduction of mechanical stress applied to plugged-in modules can be reduced.

In addition, a method for the integration of electronic units into an automobile electronic system is proposed, providing one or more domain computer centers for embedding electronic units forming parts of the automobile electronic system with two or more plug-in pockets for receiving two or more module housings, wherein each plug-in pocket is embedded within a respective domain computer center by at least one apparatus for decoupling a respective received module housing from environmental factors, optionally, connecting to a wired and/or wireless electrical vehicle system said two or more domain computer centers for communication between them; and accommodating at least some of said electronic units within each of two or more module housings, plugging in each of the module housings into a respective one plug-in pocket.

Thus, by accommodating the electronic units into module housings, which are then plugged in pockets embedded within domain computer centers by at least one apparatus for decoupling a respective plugged module housing from environmental factors, with the domain computer centers are connected to a electrical vehicle system for communication there between, the capability of integration even of electronic units within automobile electronic system is achieved in an easier way. Because the cooling and mechanical stability functionalities can be mainly shifted to the domain computer centers embedding the plug-in pockets, even complex electronic control units into which specific vehicle functionality are centralized can be integrated also in harsh environments within a controlled and optimized operating environment. By encapsulating the embedded plug-in pocket inside the domain computer centers with cages having anti-electromagnetic influence capabilities, such cages can be easily adapted in advanced to the respective requirements of electronic units including electronic control units based on their individual forms, fits, and/or functions. Moreover, by the provision of such plug-in pockets, the performances of domain computer centers can be easily changed or extended with regard to hardware by only replacing module housings accommodating respective different electronic units thereby even enabling a flexible enhancement of software scalability and memory capabilities of respective individual domain computer centers.

Due to the possibility of easy and flexible replacement of electronic units within domain computer centers, even sustainable security update capabilities, in particular concerning to cyber-security and/or encryption capabilities, can be easier and faster adapted to new or future automotive requirements.

As each domain computer domain and hence, the overall automobile electronic system can be individually designed with an overall optimization based on a cross department alignment, the costs within the development can be reduced, as the respective hardware to be incorporated does need have to be optimized for itself, but the hardware, even standard hardware can be assembled according to the wanted overall system.

Thus, even the costs at the expense of the vehicle manufacturers can be reduced within spare parts management including obsolescence management, because the respective electronic units and the hardware incorporated within a automobile electronic system, can be replaced or upgraded by units that meet the latest technical standards, whenever needed or necessary due to outdated designs, because of electronic industry dynamics for example (semiconductor product life cycles today are often not compatible with vehicle life cycle), or due to new and increasing demands.

Reference will now be made to the drawings in which the various elements of embodiments will be given numerical designations and in which further embodiments will be discussed.

Specific references to components, process steps, and other elements are not intended to be limiting. Further, it is understood that like parts bear the same or similar reference numerals when referring to alternate FIGS. It is further noted that the FIGS. are schematic and provided for guidance to the skilled reader and are not necessarily drawn to scale. Rather, the various drawing scales, aspect ratios, and numbers of components shown in the FIGS. may be purposely distorted to make certain features or relationships easier to understand.

Figure 1:
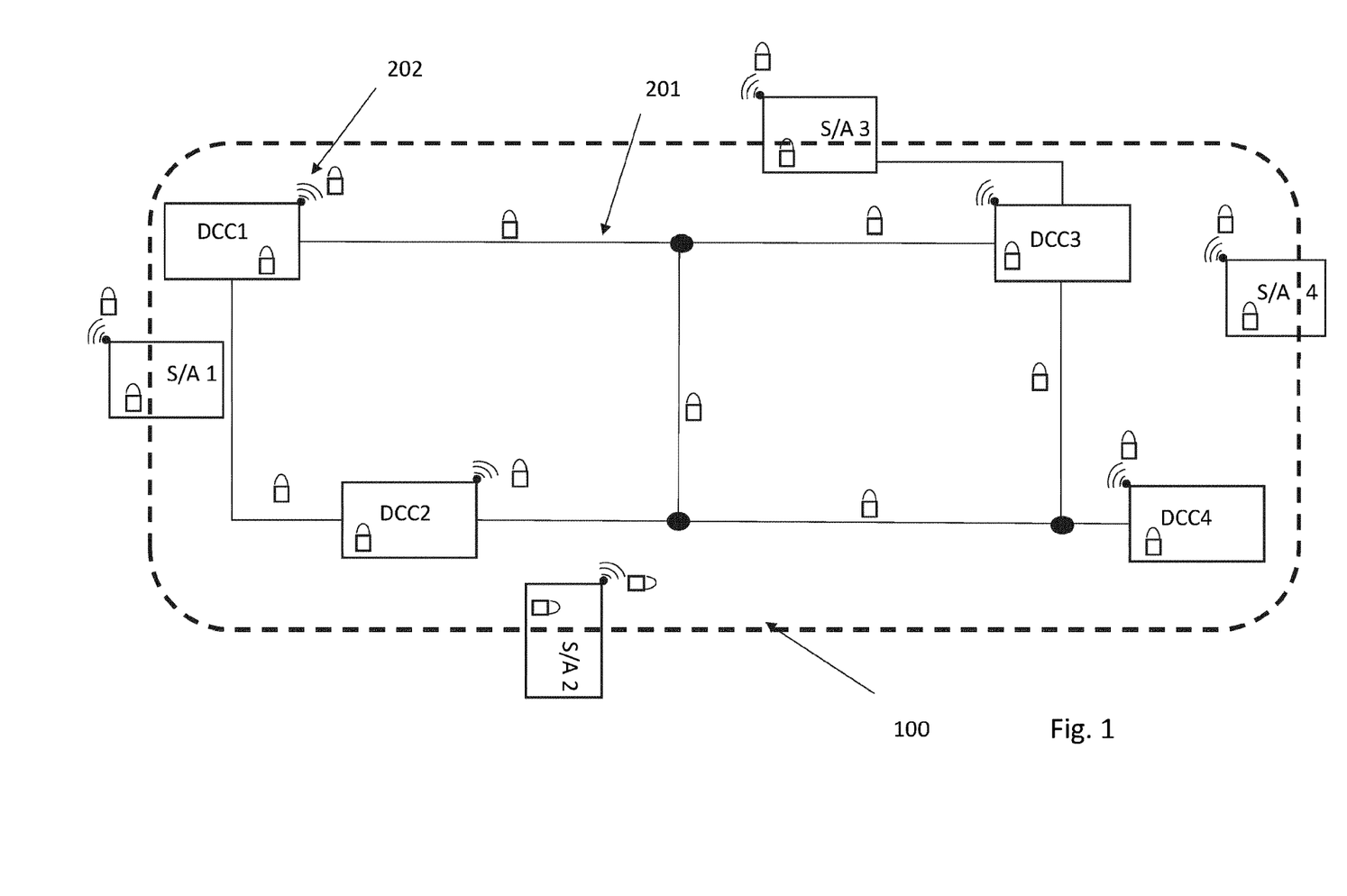
FIG. 1 shows an exemplary automobile electronic system comprising one or more domain computer centers for embedding electronic units forming parts of the automobile electronic system, the domain computer centers may be interconnected by a wired and/or wireless electrical vehicle system for communication between them and with sensor and actuator units distributed around the vehicle chassis.

FIG. 1 is showing in a very abstract view an automobile electronic system, i.e., a complex electronic system meant to be used in automobiles. An automobile or vehicle, inside which the automobile electronic system is integrated, is therefore referenced by the reference sign 100. The automobile electronic system comprises one or more domain computer centers, according to the depicted embodiment four domain computer centers DCC1, DCC2, DCC3, DCC4, for embedding electronic units forming parts of the automobile electronic system. Accordingly, the electronic units of each domain computer center and hence, each domain computer center for example is responsible for a specific domain within the automobile electronic system. In this regard, each of the domain computer centers for example has an own operating system that manages the hardware and software resources within such domain computer center and provides common services among the domain computer centers.

As can be seen, the domain computer centers are interconnected by an electrical vehicle system for communication between them and hence, for example even between the electronic units respectively embedded within the domain computer centers. Such an electrical vehicle system for communication can be of wired interconnections 201 and/or of wireless interconnections 202. In this regard, the domain computer centers each of which having a housing, for example have respective antenna devices attached to said housing from the outside (FIG. 8) to avoid unwanted interactions with the electronic units embedded inside the module housings of domain computer centers and to realize a wireless communication very efficiently, i.e., in particular range optimized and range limited. For example, as depicted, both kinds of interconnections or communication paths a provided as two diversity communication paths, i.e., wired communication paths and wireless communication paths in parallel or redundant. By using wired communication paths 201 and wireless communication paths 202 within the vehicle electrical system as redundant communication paths or interconnections, the functional safety of the entire automobile electronic system can be further increased and hence, is in particular suitable for supporting requested "fail operational" design approaches beyond "fail save" strategies for future autonomously driving cars. Often however, such an electrical vehicle system for communication is based on only one of wired interconnections 201 or of wireless interconnections 202, but can be upgraded with the other one by use of the architecture implementing elements, as described further below.

Figure 8:
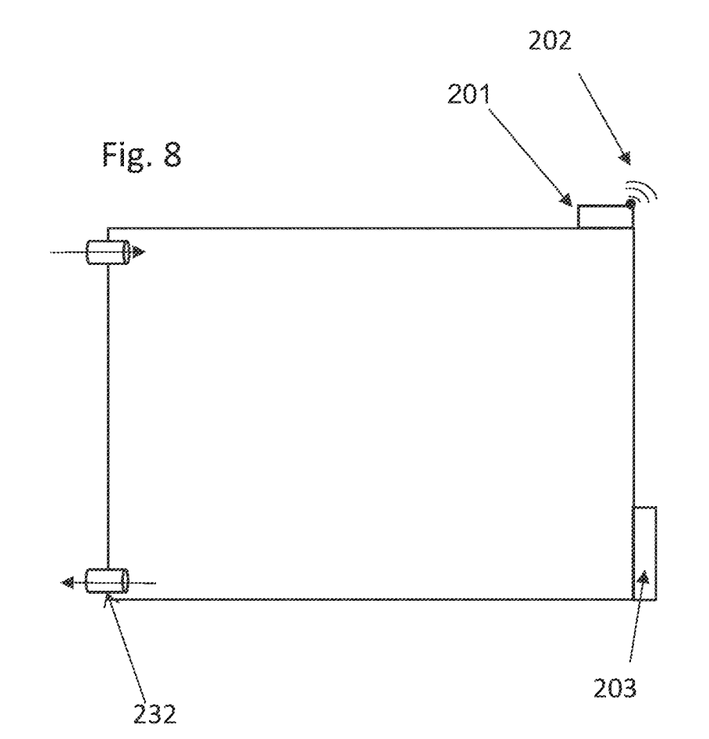
FIG. 8 shows an exemplary partial view seen from the side of a domain computer center together with some further exemplary components integrated therewith.

Based on FIG. 1, it should be mentioned that even if, for reasons of clarity, only interconnections or communication paths between the domain computer centers DCC1, DCC2, DCC3 and DCC4 are depicted, it is self-evident for a person skilled in the art, that further communication connections (wired and/or wireless) may be incorporated within the automobile electronic system, such as for example between the domain computer centers and sensors for detecting events or changes in the vehicle environment and sending the detected information to other electronics that is responsible for moving and controlling a mechanism or the like and/or between the domain computer centers and actors being a mechanism by which the automobile electronic system acts upon the vehicle environment based on a corresponding control signal. Moreover, even potential supply lines between the sensors/actors and the domain computer centers and/or between the domain computer centers and a battery or generator as well as power supply entities of the domain computer center for providing power supply to sensors/actors and/or plugged, below described module housing 220a, 220b, 220c, 220d are not depicted for reasons of clarity. A connector 203 of a domain computer center for the provision of power supply by a battery or generator however, is depicted in FIG. 8.

As described in more detail below and based on embodiments, the domain computer centers DCC1, DCC2, DCC3, DCC4 embed electronic units especially necessary electronic control units (ECU) but even other electronic hardware components forming parts of the automobile electronic system or at least for a specific domain thereof. Therefore, each domain computer center comprises two or more plug-in pockets 210, as exemplarily sketched in FIG. 2 based on the domain computer center DCC1, and into each of such plug-in pocket 210 a module housing 220a, 220b, 220c, 220d accommodating at least one of said electronic units can be plugged. Of course, depending on a respective embodiment of automobile electronic system it must not be necessary, that in each plug-in pocket 210 such a module housing 220a, 220b, 220c, 220d is plugged, i.e., some of these plug-in pockets 210 may be still free or unused, as depicted for example with regard to the three plug-in pockets 210 to the right of FIG. 2. Only connector plugs 215 of said domain computer center inside the three plug-in pockets 210 are visible with which counter connector plugs of further module housings can be plugged when plugging in such further module housings into the free plug-in pockets.

Figures 2, 3:
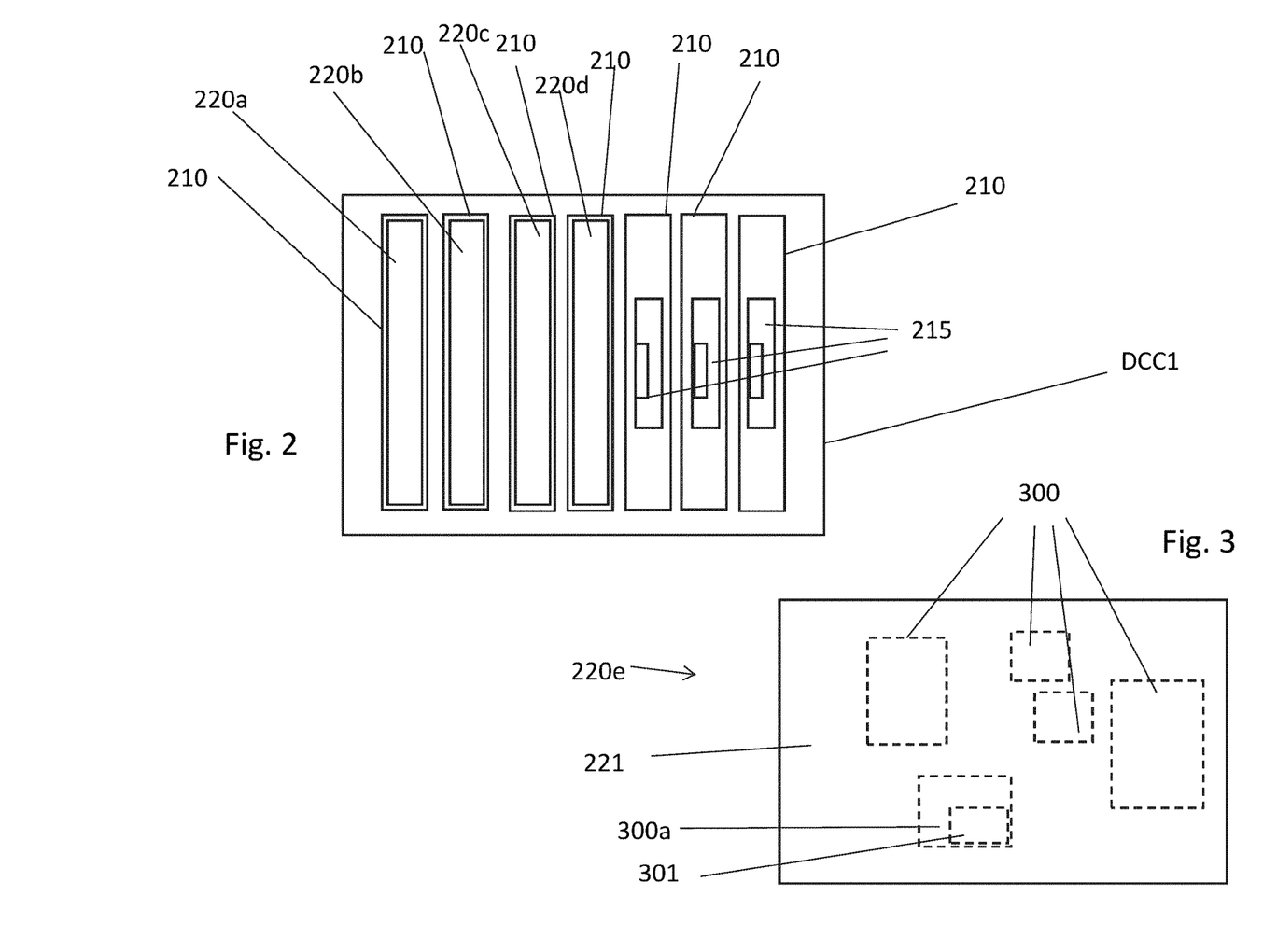
FIG. 2 shows an exemplary plurality of module housings docket into a domain computer center seen from a front view.
FIG. 3 shows an exemplary module housing inside view seen from the side with some electronic units arranged to be accommodated or housed within the module housing.

However, taking into account the above description at least two or more module housings 210, each of which accommodating at least one of said electronic units are incorporated within the automobile electronic system and in practical implementation with multiple domain computer centers appropriately distributed among at least two domain computer centers that can communicate with each other. Furthermore, such module housings 220a, 220b, 220c, 220d are for example standardized but combine a flexible compatibility design principle that addresses change, obsolescence and spare part management. Moreover, each plug-in pocket 210 is embedded within a respective domain computer center by at least one apparatus for decoupling a respective plugged module housing from environmental factors. Thus, due to the construction principle of the automobile electronic system comprising one or more domain computer centers DCC1, DCC2, DCC3, DCC4, as well as of the domain computer centers DCC1, DCC2, DCC3, DCC4 and of the module housings 220a, 220b, 220c, 220d, simplified and standardized designs of various electronic units can be used, added and/or changed for the integration within an automobile electronic system depending on the respective wanted or needed embodiment of automobile electronic system.

As a consequence and according to embodiments, the more plug-in pockets 210 are embedded within each domain computer center, the more module housings can be flexibly integrated therewith supplementing the extension and/or doubling of electronic units for easily enhancing the overall scalability, redundancy, memory capabilities etc. Thus, even the module housings 210 for example are standardized for the easy integration of various electronic units and in particular electronic control units each constructed into such a module housing. Furthermore, since each plug-in pocket 210 is embedded within a respective domain computer center by at least one apparatus for decoupling a respective plugged module housing from environmental factors, such as from harsh vehicle shock, vibration, humidity and/or temperature events, the electronic units can be operated in a very controlled environment leading to more relaxed reliability/lifetime requirements. Based thereon, this also leads to simplified and standardized test approaches.

Environmental factors as referred to herein comprise harsh environmental conditions in the vehicle. These may result from the operating conditions such as self-heating, external heating, design-related mechanical stress, etc., from interactions with attachments (e.g., vibration transmission from various locally used electric motors/actuators, etc.), as well as from external environmental conditions.

Summarizing, the afore described integration of electronic units into an automobile electronic system, each of two or more domain computer centers for embedding electronic units forming parts of the automobile electronic system with two or more plug-in pockets are provided for receiving two or more module housings, wherein each plug-in pocket is embedded within a respective domain computer center by at least one apparatus for decoupling a respective received module housing from environmental factors and said two or more domain computer centers are connected to a wired and/or wireless electrical vehicle system for communication between them. Thereafter, into a respective one plug-in pocket, a module housing can be plugged in, with the module housing selectably accommodating at least some of said electronic units.

The module housing 220a for example, may accommodate at least one electronic unit being a wired communication protocol electronic unit enabling at least one communication protocol for the communication between the domain computer centers DCC1, DCC2, DCC3, DCC4, in particular with a communication protocol being selectable as a specific communication protocol to be used for communication being selectable.

Hence, by optionally containing at least one communication protocol ECU that defines the data transfer format between DCCs along the wired vehicle electrical system the data transfer rate between DCCs can be increased for older vehicles and may provide an automobile electrical system upgradability by just changing this module housing by another accommodating a corresponding at least one electronic unit supporting a newer transfer protocol standard, as communication standards evolve and as of course, when vehicle integrated data cables could support such newer transfer protocol standards. Moreover, depending on individual module housing 220a capabilities or by integration of more than one, the domain computer centers operating system could select the data transfer protocol to be used by and between DCCs thereby assisting an automobile electrical system configurability. In this regard, such a wired communication protocol ECU may even host a portfolio of communication interfaces enabling communication protocols, like CAN, LIN, Ethernet, PCIe, or HDMI, to be flexibly software enabled by the domain computer center's operating system.

The module housing 220b for example, may accommodate at least one electronic unit being a wireless communication protocol electronic unit enabling at least one communication protocol for the communication between the at least two domain computer centers DCC1, DCC2, DCC3, DCC4, also in particular with a communication protocol being selectable as a specific communication protocol to be used for communication.

Hence, by optionally containing at least one wireless communication protocol ECU that defines a data transfer format between DCCs in addition along the wired electrical vehicle system, a wireless communication protocol, such as WLAN, WLANp, Bluetooth, 4G or 5G for example, may replace or complement/extend wired data connections between DCCs and/or a parallel (redundant) wireless path within the automobile electrical system support a requested "fail operational" design approaches beyond "fail save" strategies for autonomously driving cars. In this regard, such a wireless communication protocol ECU may even host a portfolio of communication interfaces enabling a variety of communication protocols like the afore mentioned, to be flexibly software enabled by the domain computer center's operating system.

The module housing 220c, for example, may accommodate at least one electronic unit including components for providing a "power over data-line" functionality and hence, to realize at least a "minor" power supply via the communication paths between the domain computer centers at least as a support functionality in an emergency operation.

On the other hand, the module housing 220d, for example, may accommodate at least one electronic unit including components for providing a "power line communication" functionality and hence, to realize a data communication via the supply lines at least between the domain computer centers, in particular for the event that high-voltage systems-based domain computer centers are integrated within the automobile electronic system.

Besides the before described examples of electronic units housed within module housings, FIG. 3 shows in an abstract sketch some exemplary electronic units 300, 300a arranged and to be accommodated or housed within a module housing 220e by a view inside such module housing and seen from the side. The exemplary electronic units 300, 300a are arranged for example on a printed circuit board 221, for example. As mentioned above, due to the concept of integration or embedding electronic units forming parts of the automobile electronic system most of the electronic units 300 used can be of simplified and standardized design, and hence are not further described. Regarding one of the electronic units 300, 300a in more detail, for example 300a, this could be one of the electronic units described above in connection with the module housings 220a, 220b, 220c or 220d or even a further specialized electronic control unit, Such a further specialized electronic control unit may be adapted for correct and secure registration of the further embedded electronic units to the domain computer center, in particular, into the domain computer center operating system, to enable plugged-in module housings to be available for the domain computer center operating system or to be blocked/not accepted, and/or for secure communication, in particular by the additional incorporation of encryption/decryption functionality of respective signals for example, involved with the embedded electronic units.

Such a specialized electronic control unit 300a may be also adapted to handle these control functionalities even for electronic units of other module housings, like module housing 220a, 220b, 220c and/or 220d. Therefore, a specific and individually constructed FPGA (free programmable gate array) or a SoC (system on chip) with FPGA components forming a security module could be part of the electronic control unit 300a to protect group "user functions" of a specific automotive manufacturer, like "Volkswagen" for example, realized through the combination of an operating system software of such specific automotive with the hardware used within the automobile electronic system. Thus, the afore-described security functions may be programmed or even reprogrammed. In FIG. 3 a chip 301 is comprised by the electronic control unit 300a incorporating such SoC with FPGA components providing such security module functionality and in FIG. 1 the depicted lock symbols represent such security module functionality, in particular regarding the securing of correct and encrypted registration and communication.

Thus, inside the module housings in principle pure "Tier1" designs can be used, i.e., electronic units designs supplied from supplier companies directly to the automotive manufacturers, but with the option to integrate specific functions of a certain automotive manufacturer, for example an afore described security module.

Figure 4:
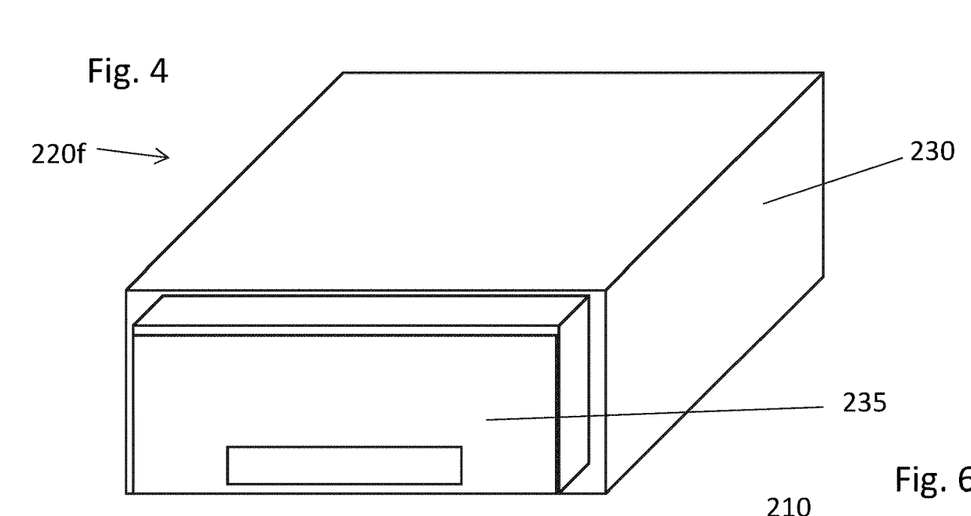
FIG. 4 shows an exemplary module housing in perspective view.
Figure 5:
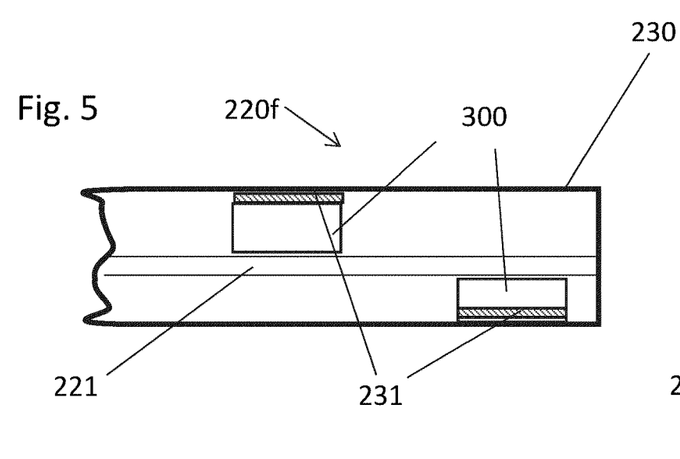
FIG. 5 shows the exemplary module housing of FIG. 4 in a cut side view together with some further exemplary components integrated therewith.

A further exemplary module housing 220f of the for example standardized module housings is sketched in FIGS. 4 and 5. As depicted, the module housing 220f for example is equipped with a mechanical stable outer housing 230 and a standardized robust automotive connector plug 235 being plugged with a respective counter connector plug 215 (FIG. 2) of a domain computer center, when plugging the module housing into a corresponding plug-in pocket of said domain computer center. In plugged condition, the domain computer center for example is constructed to provide the power supply even for the then integrated module housing. According to embodiments, the outer housing 230 is constructed such to provide a hermetic sealing for protecting the embedded electronic units 300 against corrosion. Such standardized module housings may be for example provided for different families of domain computer centers for an automobile electronic system, i.e., in particular in different sizes and/or power classes.

Furthermore, the material of the outer housing 230 is for example chosen for practical implementation such, that the thermal resistance Rth is kept low or as small as possible, to already enable cooling of semiconductors or other circuit elements in electronic circuits of the electronic units 300, 300a included within the module housing as good as possible. In addition to the heatsink function already provided by the outer housing 230 of module housing itself, between the electronic units 300, 300a, placed for example even on both sides of a printed circuit board 221 therein, and the outer housing 230 an additional thermal interface material 231, such as a foil, can be arranged for still enhancing the heatsink function. Such material may further serve the purpose of mechanically securing the printed circuit board 221 within the housing 230.

Figure 6:
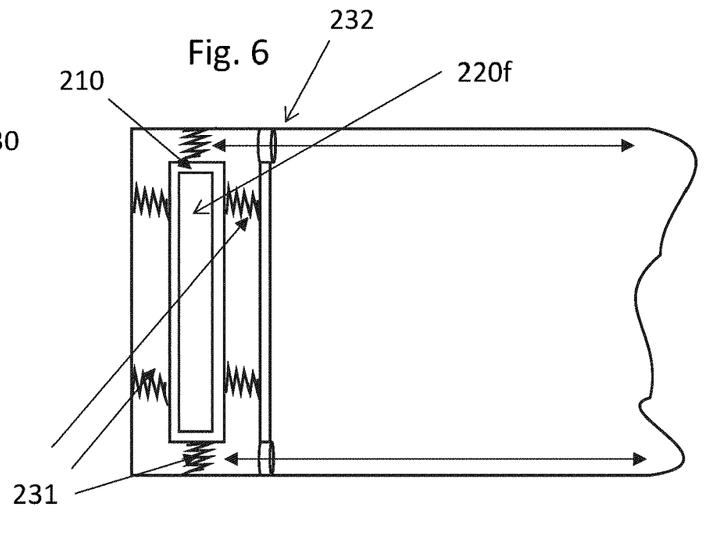
FIG. 6 shows an exemplary partial view into the inside of an exemplary domain computer center with some exemplary apparatuses integrated therewith for decoupling the plugged module housing of FIG. 4 from environmental factors.

For further decoupling plugged module housings from environmental factors, the plug-in pockets 210 or sockets may be embedded within the domain computer centers for example using damping means, e.g., one or more spring-dampers or spring-bumper apparatuses 231, as sketched in FIG. 6. Additionally or alternatively, the damping means can be based on an elastomer-damper, e.g. an elastomer anti-shock pad, buffer or coating, which provide less weight, require lower volume and are easier to integrate (less construction complexity) compared to spring-based shock absorbers. This provides resistance to vehicle environmental effects (like shock, vibration and absorption of heat-based module housing expansion stress that otherwise may transfer to electronic components on the PCB). The damping means is configured to absorb mechanical stress evoked from the outside onto the domain computer center, the plug-in pockets, respectively. The damping means is configured to at least partly decouple the plug-in pockets 210 mechanically from the outer housing of the domain computer center.

Thereby, shocks or vibrations applied to the outer housing of the domain computer center can at least partly be absorbed or be reduced for the plug-in pockets 210. Having mechanically damped plug-in pockets allows relaxing structural requirements for the module housings. For example, in automotive there is a requirement that housed electrical components need to be spaced away from their housing in order to avoid mechanical interaction. However, since the damping means decouples the plug-in pockets 210 and the module housing 230 along with it, mechanical stress on the module housing 220 is reduced and the structural requirements for the module housing 230 can be reduced.

With the reduced structural requirements, it is also possible to use a mechanical coupling of the printed circuit board 221 and/or its components 300 and the module housing 230. Such a mechanical coupling can be used for heath dissipation and for mechanically stabilizing the printed circuit board 221 relative to the module housing 230, the components 300 thereon, respectively. Mechanical stress on the printed circuit board 221, its components 300, and the (soldering) connection between them can also be generated by thermal stress, which is relative to the power consumption on the board and heath dissipation. With the reduction of the outer mechanical influences through utilization of the damping means the structural requirement can be relaxed. With the relaxed requirements heath conduction elements 231 can be used for mechanical stabilization and heath dissipation of the printed circuit board 221 and its components 300 through mechanical coupling of with the module housing 230.

In addition or as an alternative embodiment, the domain computer centers may equipped with a cooling apparatus 232 for cooling module housings plugged-in and thus, for decoupling plugged module housings from environmental temperature events. Such a cooling apparatus 232 can be constructed based on respective intended areas of application as a respective liquid-cooling variant and/or as an air-cooling variant. Accordingly, in particular for areas of application, where the outer housings 230 are already constructed to provide a hermetic sealing for the provision of the embedded electronic units against corrosion, a liquid-cooling variant of cooling apparatus 232 is possible, as this also decouples the plugged module housings from environmental humidity events and hence, for example can ensure for an optimized-climate.

Additionally or alternatively, there can be a galvanic isolation of the modules.

The module housings 220 may hence be configured for liquid cooling. For example, a cooling liquid may flow around the housings and/or the housings may comprise in- and outputs implemented to enable a cooling liquid to flow through the module housing 220. In some embodiments the housing may comprise a double wall to guide a cooling liquid. Using liquid cooling allows for a better or higher heath dissipation away from the electrical components. Therefore, higher power components can be used and the lifetime of electrical components can be prolonged.

Taking into account the above description, beside at least one apparatus embedding each plug-in pocket within the domain computer centers adapted for ensuring anti-shock, anti-vibration, optimized-climate (humidity) and/or optimized work-temperature assurance capabilities, the domain computer centers, of course for example include in addition the functionality to decouple the module housings from the electrical vehicle system in terms of electrical disturbances.

Thus, the module housing with the electronic units accommodated therein, accordingly do not need a reverse polarity protection, in particular when compared with today's ECUs, as this is ensured by the domain computer centers. As furthermore current and voltage spikes from the electrical vehicle system then can also be filtered by the domain computer centers, the module housings can be very simplified designed with respect to electrostatic discharge and hence needing less electronic components.

Figure 7:
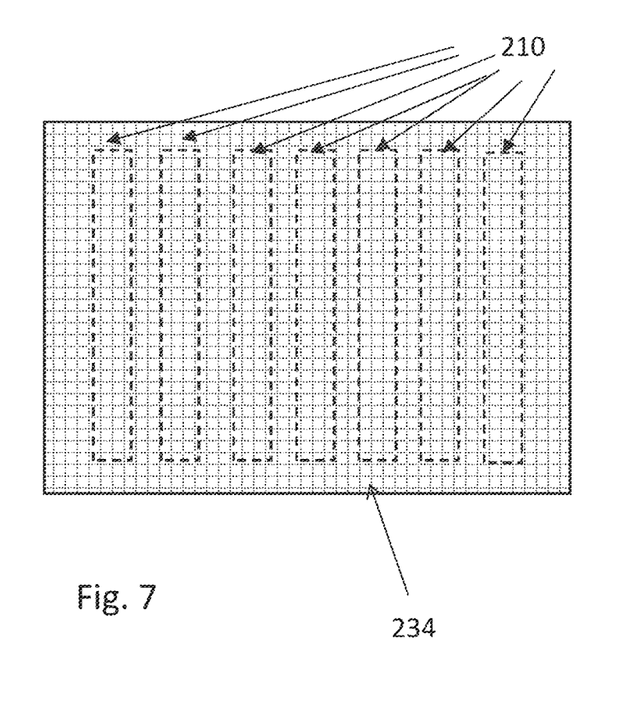
FIG. 7 shows an exemplary sectional view seen from the rear side of a domain computer center together with some further exemplary components integrated therewith.

To additionally protect the embedded module housings even against electromagnetic influences the plug-in pockets being for example electromagnetic encapsulated by a cage 234 within the domain computer centers as sketched in FIG. 7 showing an exemplary sectional view seen from the rear side of a domain computer center, providing an anti-electromagnetic influence capability. According to embodiments each plug-in pocket being separately electromagnetic encapsulated by such a cage, thereby for example enabling individually adjustment of a respective cage potential to optimize the electromagnetic compatibility for each plug-in pocket and hence, for a respective intended kind of plugged module housing separately.

The invention has been described in the preceding using various exemplary embodiments. Other variations to the disclosed embodiments may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The term "exemplary" used throughout the specification means "serving as an example, instance, or exemplification" and does not mean "preferred" or "having advantages" over other embodiments.

The mere fact that certain measures are recited in mutually different dependent claims or embodiments does not indicate that a combination of these measures cannot be used to advantage. Any reference signs in the claims should not be construed as limiting the scope.

What is claimed is:

1. An automobile electronic system, comprising:
   two or more domain computer centers for embedding electronic units forming parts of the automobile electronic system;
   wherein the two or more domain computer centers are interconnected by at least one of wired interconnections or wireless interconnections for communication between the two or more domain computer centers; and
   wherein each of the domain computer centers comprises two or more plug-in pockets each having a respective module housing plugged therein, each module housing accommodating at least one of said electronic units;
   wherein each plug-in pocket is embedded within a respective domain computer center by at least one apparatus for decoupling a respective plugged-in module housing from environmental factors; and
   at least one of the domain computer centers further having a liquid-cooling apparatus integrated for cooling plugged-in module housings.

2. A domain computer center for an automobile electronic system,
   wherein the domain computer center is constructed for embedding electronic units forming parts of the automobile electronic system and to be interconnected with at least a further of such domain computer center by a wired and/or wireless electrical vehicle system for communication between them;
   wherein the domain computer center comprises two or more plug-in pockets, into each of which a module housing accommodating at least one of said electronic units may be plugged-in; and
   wherein each plug-in pocket is embedded within the domain computer center by at least one apparatus for decoupling a respective plugged-in module housing from environmental factors;
   at least one of the domain computer centers further having a liquid-cooling apparatus integrated for cooling plugged-in module housings.

3. The domain computer center of claim 2, having a housing and an antenna device attached to said housing from the outside.

4. The domain computer center of claim 2, comprising at least one damper for plugged-in module housings.

5. The domain computer center of claim 4, wherein the damper comprises an elastomer buffer.

6. The domain computer center claim 4, wherein the damper is configured to absorb mechanical stress from the plug-in pockets.

7. The domain computer center of claim 2, wherein the plug-in pockets are electromagnetically encapsulated, with each plug-in pocket being separately electromagnetically encapsulated by a cage.

8. The domain computer center of claim 2, constructed for providing power supply entity for providing power supply to the plugged-in module housings.

9. The domain computer center of claim 2, adapted for decoupling the plugged-in module housings from the automobile electronic system in terms of electrical disturbances.

10. The domain computer center of claim 3, comprising at least one damper for plugged-in module housings.

11. The domain computer center of claim 5, wherein the damper is configured to absorb mechanical stress from the plug-in pockets.

12. The domain computer center of claim 3, with the plug-in pockets being electromagnetically encapsulated, with each plug-in pocket being separately electromagnetically encapsulated by a cage.

13. The domain computer center of claim 4, with the plug-in pockets being electromagnetically encapsulated, with each plug-in pocket being separately electromagnetically encapsulated by a cage.

14. The domain computer center of claim 5, with the plug-in pockets being electromagnetically encapsulated, with each plug-in pocket being separately electromagnetically encapsulated by a cage.

15. A module housing for an automobile electronic system including two or more domain computer centers,
   wherein the module housing accommodates at least one electronic unit and being designed to be plugged-in in a plug-in pocket of a respective domain computer center for embedding electronic units forming parts of the automobile electronic system;
   wherein the automobile electronic system is configured to interconnect the two or more domain computer centers by a wired and/or wireless electrical vehicle system for communication between the domain computer centers, and
   wherein the module housing is configured to accommodate at least one electronic unit for at least one of (a) correct and secure registering of the at least one electronic unit to the respective domain computer center or (b) secure communication involving a respective electronic unit comprising a security module including a field programmable gate array (FPGA) or a system-on-chip (SoC) with FPGA components.

16. The module housing of claim 15, accommodating at least one electronic unit being a wired and/or wireless communication protocol electronic unit enabling at least one communication protocol for the communication between the at least two domain computer centers with a communication protocol being selectable as a specific communication protocol to be used for communication being selectable.

17. The module housing of claim 15, having an outer housing providing hermetic sealing for protecting the embedded electronic units against corrosion.

18. A method for the integration of electronic units into an automobile electronic system, comprising:
   providing each of one or more domain computer centers for embedding electronic units forming parts of the automobile electronic system with two or more plug-in pockets, each plug-in pocket configured to receive a respective module housing, wherein each plug-in pocket is embedded within a respective domain computer center by at least one apparatus for decoupling a respective module housing received therein from environmental factors;
   connecting the one or more domain computer centers to a wired and/or wireless electrical vehicle system for communication;
   accommodating at least some of said electronic units within each of two or more module housings;
   plugging in each of the module housings into a respective plug-in pocket; and
   using a liquid-cooling apparatus to cool module housings plugged in a respective domain computer center.

* * * * *